(12) United States Patent
Xiong et al.

(10) Patent No.: US 9,614,179 B2
(45) Date of Patent: Apr. 4, 2017

(54) DISPLAY PANEL, METHOD OF MANUFACTURING THE SAME AND DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Dong Qian, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 89 days.

(21) Appl. No.: 14/595,131

(22) Filed: Jan. 12, 2015

(65) Prior Publication Data

US 2016/0062160 A1    Mar. 3, 2016

(30) Foreign Application Priority Data

Sep. 3, 2014    (CN) .......................... 2014 1 0445305

(51) Int. Cl.
    *G02F 1/1333*      (2006.01)
    *H01L 51/52*      (2006.01)
    (Continued)

(52) U.S. Cl.
    CPC ........ *H01L 51/5246* (2013.01); *G02F 1/1339* (2013.01); *G02F 1/1341* (2013.01);
    (Continued)

(58) Field of Classification Search
    CPC ............ G02F 1/1368; G02F 1/133514; G02F 1/1339; G02F 1/3338; G02F 1/1341;
    (Continued)

(56) References Cited

U.S. PATENT DOCUMENTS

| | | | | |
|---|---|---|---|---|
| 6,486,932 B1* | 11/2002 | Nakao | ................... | G02F 1/1341 349/127 |
| 2002/0180712 A1* | 12/2002 | Sato | ........................ | G09F 13/04 345/173 |
| 2003/0168966 A1* | 9/2003 | Kobayashi | .......... | H01L 27/3246 313/495 |

FOREIGN PATENT DOCUMENTS

| | | |
|---|---|---|
| CN | 1347517 A | 5/2002 |
| CN | 1427390 A | 7/2003 |

(Continued)

*Primary Examiner* — Charles Chang
(74) *Attorney, Agent, or Firm* — Anova Law Group, PLLC

(57) ABSTRACT

The invention discloses a display panel, a method of manufacturing the same and a display device so as to simplify a process of transmitting an electrical signal between a first substrate and a second substrate of the display panel at a lower cost. The display panel includes a first substrate and a second substrate disposed opposite to each other. The first substrate has a concave groove surrounded by a convex section and facing the second substrate. The display panel also includes an electrode layer on the surface of the groove and having at least one first conductive section extending outward from inside of the concave groove to the top end face of the convex section; and at least one second conductive section on the second substrate and electrically connected with the respective first conductive section.

12 Claims, 10 Drawing Sheets

(51) Int. Cl.
*G02F 1/1339* (2006.01)
*H01L 27/32* (2006.01)
*G02F 1/1341* (2006.01)

(52) U.S. Cl.
CPC ........ *G02F 1/13338* (2013.01); *H01L 27/323* (2013.01); *H01L 27/3244* (2013.01); *H01L 51/5203* (2013.01); *H01L 51/524* (2013.01); *G02F 2001/133354* (2013.01)

(58) Field of Classification Search
CPC ..... G02F 2001/133354; H01L 51/5246; H01L 27/323; H01L 51/5203; H01L 51/524; H01L 27/3244
USPC .......................................................... 349/158
See application file for complete search history.

(56) References Cited

FOREIGN PATENT DOCUMENTS

| | | | |
|---|---|---|---|
| CN | 101311787 A | 11/2008 | |
| CN | 101339314 A | 1/2009 | |
| CN | 102299166 A | 12/2011 | |
| CN | 103268883 A | 8/2013 | |

\* cited by examiner

DISPLAY PANEL, METHOD OF MANUFACTURING THE SAME AND DISPLAY DEVICE

CROSS-REFERENCES TO RELATED APPLICATIONS

This application claims the benefit of priority to Chinese Patent Application No. 201410445305.3, filed with the Chinese Patent Office on Sep. 3, 2014 and entitled "DISPLAY PANEL, METHOD OF MANUFACTURING THE SAME AND DISPLAY DEVICE", the content of which is incorporated herein by reference in its entirety.

FIELD OF THE INVENTION

The present invention relates to the field of touch control display technologies and particularly to a display panel, a method of manufacturing the same and a display device.

BACKGROUND OF THE INVENTION

Flat panel displays having a small size, lightweight, low power consumption, no radiation and other features, such as Thin Film Transistor Liquid Crystal Display (TFT-LCD), Organic Light Emitting Diode (OLED) displays, and the like, have been developed rapidly in recent years.

A display panel of a flat panel display typically includes a first substrate, e.g., a color filter substrate of an LCD display or a package substrate of an OLED display, and a second substrate, e.g., a Thin Film Transistor (TFT) array substrate of an LCD display or an OLED display. When a common electrode or an inbuilt touch control pad of the display panel above is formed on the first substrate, a display function or a touch control function needs to be performed by providing a conduction scheme of electrically connecting the common electrode or the inbuilt touch control pad on the first substrate with a TFT array circuit on the second substrate. In the prior art, typically such a conduction scheme of electrically connecting a Flexible Printed Circuit Board (FPC) is adopted that one ends of a plurality of Flexible Printed Circuit Boards (FPCs) are bonded on the common electrode or the inbuilt touch control pad on the first substrate and the other ends thereof are bonded on leads of the TFT array circuit of the TFT array substrate respectively in two bonding processes so that the common electrode or the inbuilt touch control pad on the first substrate are electrically connected with the TFT array substrate on the second substrate. However, an implementation of such a conduction scheme requires multiple FPCs which have to be bonded twice, thus making the process flow complicated and costly.

BRIEF SUMMARY OF THE INVENTION

An object of the invention is to provide a display panel, a method of manufacturing the same and a display device so as to simplify a process of transmitting an electrical signal between a first substrate and a second substrate of the display panel at a lower cost.

The object of the invention can be achieved with the following technical solutions:

An embodiment of the invention provides a display panel including: a first substrate and a second substrate disposed opposite to each other, wherein the first substrate has a concave groove, which is surrounded by a convex section disposed on the outer periphery of the first substrate and facing the second substrate. The display panel also includes an electrode layer disposed on the surface of the concave groove and including at least one first conductive section extending outward from inside of the concave groove to the top end face (top surface) of the convex section. The display panel further includes at least one second conductive section disposed on the second substrate and electrically connected with the first conductive section.

An embodiment of the invention provides a display device including the display panel according to the embodiment above.

An embodiment of the invention provides a method of manufacturing a display panel. The method includes providing a first substrate; forming a concave groove in the first substrate surrounded by a convex section on the outer periphery of the first substrate; and forming an electrode layer on the surface of the concave groove. The electrode layer includes at least one first conductive sections extending outward from inside of the concave groove and located on the top end face (top surface) of the convex section. The method also includes providing a second substrate; forming at least one second conductive section on the second substrate associated with the first conductive section; and bringing the first substrate and the second substrate together with the first conductive section in direct contact with the second conductive sections to form the display panel.

The embodiments of the invention have the following advantageous effects: the concave groove is disposed in the first substrate, and the electrode layer configured to perform a touch control function is formed on the surface of the concave groove so that the electrode layer extends outward from inside of the concave groove onto the convex section surrounding the concave groove to form the first conductive sections, and the first substrate and the second substrate can be bonded together to thereby electrically connect the first conductive sections with the second conductive sections so that an electrical signal is transmitted between the first substrate and the second substrate. The implementation process of this conduction scheme is simple and low cost.

DETAILED DESCRIPTION OF THE INVENTION

Figure 1:
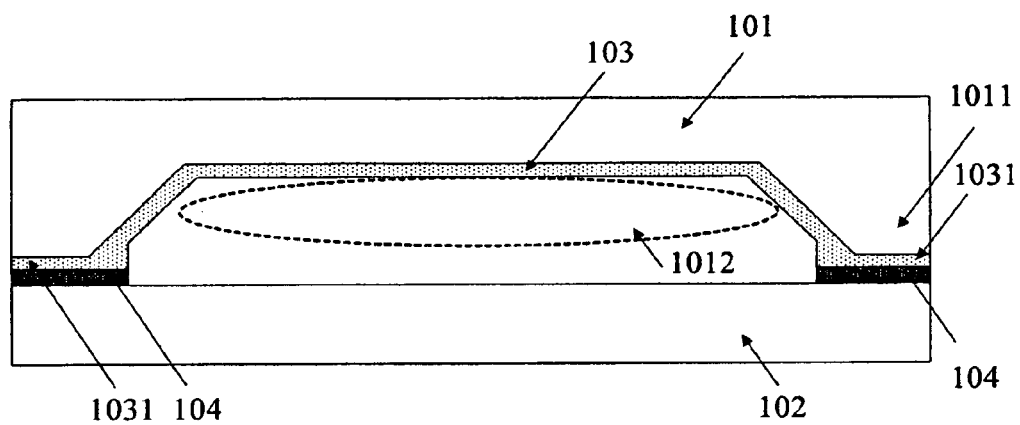
FIG. 1 is a simplified cross-sectional view of a display panel according to an embodiment of the invention in a sectional view.

Implementations of the embodiments of the invention will be described below in details with reference to the drawings. It shall be noted that identical or like reference numerals through the drawings represent identical or like elements or elements with identical or like functions. The embodiments described below with reference to the drawings are illustrative and merely intended to explain but not to be construed as limiting the invention.

First Embodiment

Figure 2:
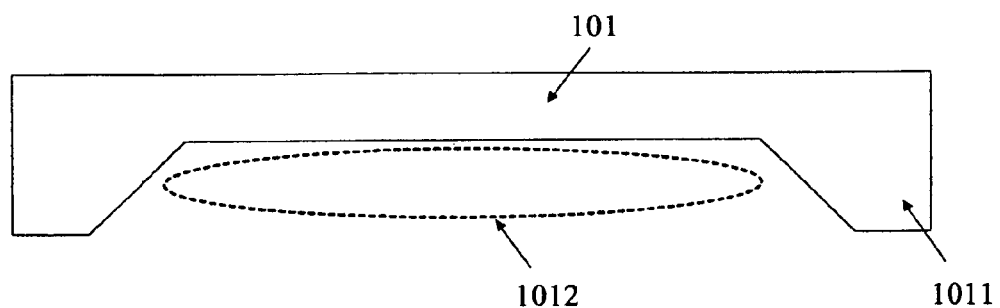
FIG. 2 is a simplified cross-sectional view of a first substrate with a convex section according to an embodiment of the invention in a sectional view.

Referring to FIG. 1, an embodiment of the invention provides a display panel including:

A first substrate 101 and a second substrate 102 disposed opposite to each other; wherein a concave groove 1012 surrounded by a convex section 1011 is disposed on the side of the first substrate 101 opposite to the second substrate 102. FIG. 2 illustrates a simplified cross-sectional view of the first substrate 101 including the convex section 1011 and the concave groove 1012. In FIG. 1, an electrode layer 103 including at least one first conductive section 1031 extending outward from inside of the concave groove 1012 and located on the top end face of the convex section 1011 is disposed on the surface of the concave groove 1012; and at least one second conductive section 104 electrically connected with the first conductive section 1031 respectively is disposed on the second substrate 102.

In the embodiment of the invention, the concave groove 1012 is disposed on the first substrate 101, and the electrode layer 103 configured to perform a touch control function is formed on the surface of the concave groove 1012 so that the electrode layer 103 extends outward from inside of the concave groove 1012 onto the convex section 1011 surrounding the concave groove 1012 to form the first conductive section 1031, and the first substrate 101 and the second substrate 102 can be bonded together to thereby electrically connect the first conductive section 1031 with the second conductive section 104 so that an electrical signal is transmitted between the first substrate 101 and the second substrate 102, and the implementation process of this conduction scheme is simple and low cost.

Figure 3:
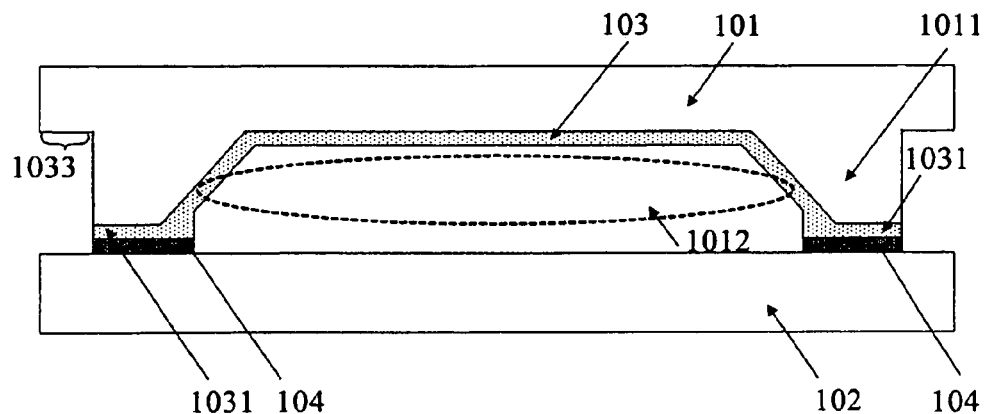
FIG. 3 is a simplified cross-sectional view of another display panel according to an embodiment of the invention in a sectional view.
Figure 4:
FIG. 4 is a simplified cross-sectional view of the projection of a convex section onto a first substrate in the vertical direction according to an embodiment of the invention in a side view.

The location of the convex section 1011 can be disposed flexibly as needed for a real design. For example, as illustrated in FIG. 1, the convex section 1011 can be disposed in close proximity to the outer edge of the first substrate 101. In another example, there is a preset spacing 1033 between the projection 1011' of the convex section 1011 onto the first substrate 101 or the second substrate 102 in the vertical direction and the edge of the first substrate 101 or the second substrate 102. As illustrated in FIG. 3, in an alternative embodiment, there is a preset spacing (a recess) 1033 between the convex section 1011 and the edge of the first substrate 101, and as illustrated in FIG. 4, there is a preset spacing (predetermined distance) 1033 between the projection of the convex section 1011 onto the first substrate 101 in the vertical direction and the edge of the first substrate 101, where the preset distance 1033 can be configured to have a bonding material filled when the first substrate 101 and the second substrate 102 are bonded together.

Figure 5:
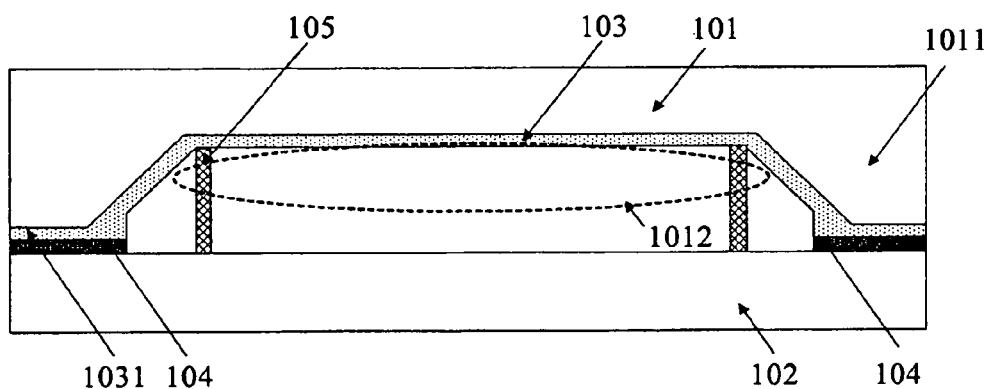
FIG. 5 is a simplified cross-sectional view of a frame seal disposed in the display panel illustrated in FIG. 1 in a sectional view.
Figure 6:
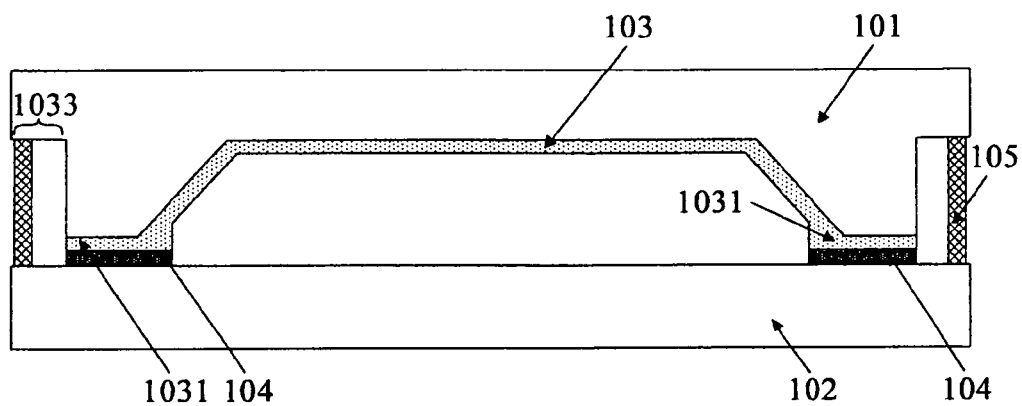
FIG. 6 is a simplified cross-sectional view of a frame seal disposed in the display panel illustrated in FIG. 3 in a sectional view.

Preferably the display panel further includes a frame seal configured to bond the first substrate 101 and the second substrate 102 together. FIG. 5 illustrates a simplified cross-sectional view of the frame seal disposed in the display panel illustrated in FIG. 1, where the frame seal 105 is located in the region of the vertical projection of the concave groove 1012 onto the first substrate 101 or the second substrate 102 (reference numerals in FIG. 5 represent the same elements as those represent by the reference numerals in FIG. 1). Likewise, FIG. 6 illustrates a simplified cross-sectional view of the frame seal disposed in the display panel illustrated in FIG. 3, where the frame seal 105 can alternatively be located in the preset spacing 1033 (reference numerals in FIG. 6 represent the same elements as those represent by the reference numerals in FIG. 3).

Figure 7:
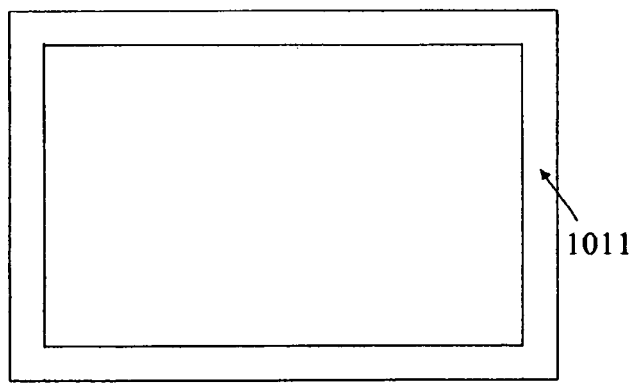
FIG. 7 is a top view of a rectangular convex section according to an embodiment of the invention.
Figure 8:
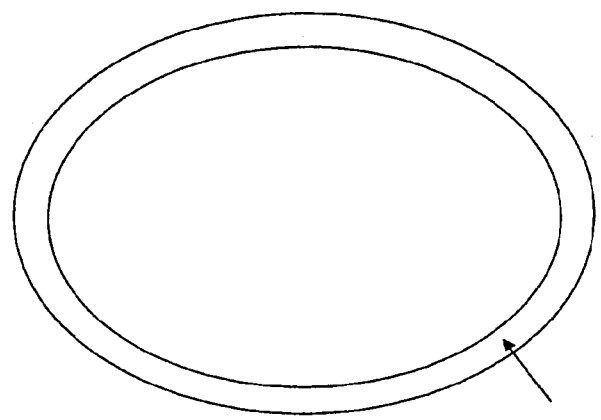
FIG. 8 is a top view of an elliptic convex section according to an embodiment of the invention.
Figure 9:
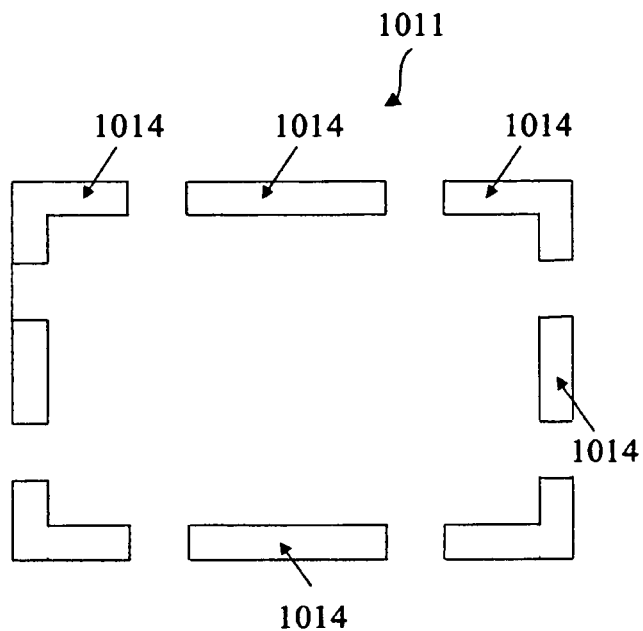
FIG. 9 is a top view of a rectangular convex section including a plurality of discrete convex sub-section according to an embodiment of the invention.

It shall be noted that the first substrate 101 and the second substrate 102 of the display panel can be rectangular, elliptic, rounded or another geometrical shape for a different application or preference. For example, they can be rectangular for a display or a TV set; or can be rectangular, elliptic or rounded for a wristwatch-like display. Correspondingly the pattern of the projection of the convex section 1011 on the first substrate 101 onto the first substrate 101 or the second substrate 102 in the vertical direction can also vary accordingly, typically to be the same as the pattern of an edge frame of the display panel, i.e., the shape of the first substrate 101 and the second substrate 102 above. FIG. 7 illustrates a top view of the rectangular convex section 1011, and FIG. 8 illustrates a top view of the elliptic convex section 1011. The convex section 1011 in both FIG. 7 and FIG. 8 is formed continuously and integrally on the first substrate in a simple processing step. Of course the convex section 1011 can alternatively be formed to include a plurality of discrete convex sub-sections, for example, the convex section 1011 illustrated in FIG. 9 includes a plurality of discrete convex sub-sections 1014, and the integral pattern of the convex section 1011 is rectangular, and it shall be noted that the integral pattern of the convex section 1011 illustrated in FIG. 9 is shown rectangular only by way of an example to illustrate that the convex section 1011 can be disposed to include the plurality of discrete convex sub-sections 1014, and in practice, the integral pattern of the convex section 1011 will not be limited to a rectangle but can be elliptic, rounded or another shape, and a particular shape thereof can be adjusted correspondingly to the particular geometrical pattern of the first substrate 101 and the second substrate 102 of the display panel for the purpose of an optimum display effect. The top end faces (surfaces) of the respective convex sub-sections 1014 of the convex section 1011 are configured to have the first conductive section 1031 disposed, so the locations of the respective convex sub-sections 1014, the spacing between the respective convex sub-sections 1014 or the length of the respective convex sub-sections 1014 are decided by the pre-arranged location of the first conductive section 1031 so that the first conductive section 1031 can be disposed as desirable and ensured to correspond to and contact with the second conductive section 104 when the first substrate 101 and the second substrate 102 are bonded together as long as an electrical signal can be transmitted between the first substrate 101 and the second substrate 102.

Figure 10:
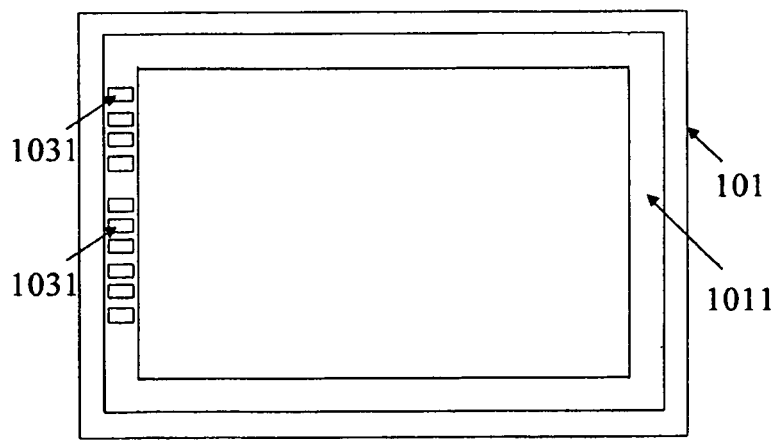
FIG. 10 is a top view of the top end face of a plurality of first conductive sections distributed on a edge frame of a rectangular convex section according to an embodiment of the invention.
Figure 11:
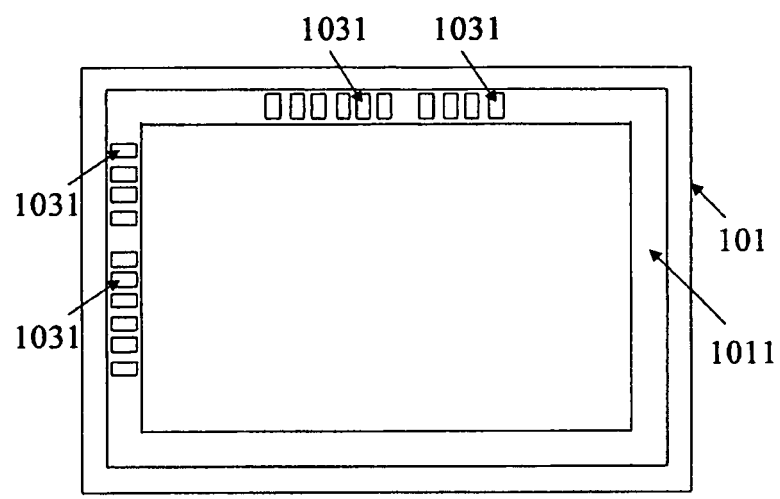
FIG. 11 is a top view of the top end face of a plurality of first conductive sections distributed on two edge frames of a rectangular convex section according to an embodiment of the invention.

The first conductive section 1031 can be distributed at different locations on the convex section 1011 and can be located in a part of the area of the entire top end face (top surface) of the convex section 1011. For example, as illustrated in FIG. 10, the pattern of the projection of the convex section 1011 onto the first substrate 101 or the second substrate 102 in the vertical direction is rectangular, and the plurality of first conductive sections 1031 are distributed on the top end face of an edge frame of the rectangular convex section 1011. In another example, as illustrated in FIG. 11, the pattern of the projection of the convex section 1011 onto the first substrate 101 or the second substrate 102 in the vertical direction is rectangular, and the plurality of first conductive sections 1031 are distributed on the top end faces (top surfaces) of two edge frames (a shorter side and a longer side) of the rectangular convex section 1011. Of course for the rectangular convex section 1011 above, the plurality of first conductive sections 1031 can alternatively be distributed on the top end faces of three or four edge frames (three or four sides) of the rectangular convex section 1011. The distribution of the first conductive sections 1031 on the convex section 1011 in another shape can be similar to the distribution of the first conductive sections 1031 on the rectangular convex section 1011, so a repeated description thereof will be omitted here.

Figure 12:
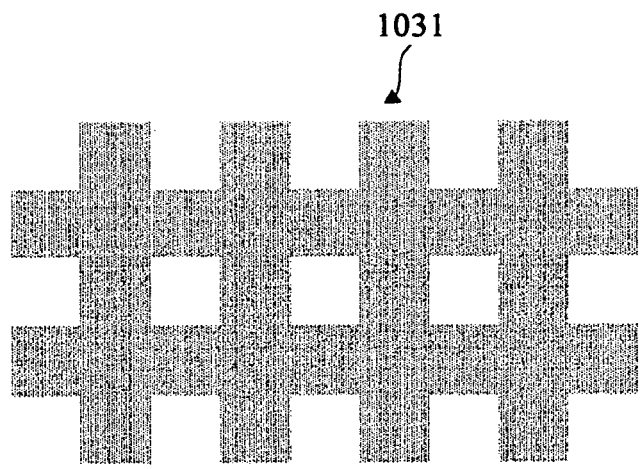
FIG. 12 is a top view of a grid-shape second conduction section according to an embodiment of the invention.
Figure 13:
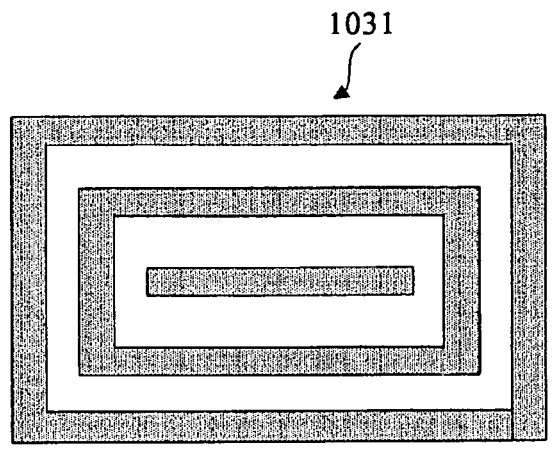
FIG. 13 is a top view of a "回"-shape second conduction section according to an embodiment of the invention.
Figure 14:
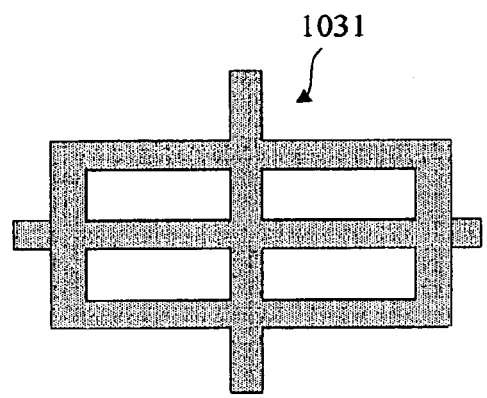
FIG. 14 is a top view of a "冊"-shape second conduction section according to an embodiment of the invention.

In the present embodiment, the second conductive section 104 is a conductive pad which can be a connection end extending out from a TFT pixel circuit on an array substrate or can be a connection end extending out from another peripheral circuit. The conductive pad can be an integral structure, or the second conductive section 104 can be disposed in other than an integral structure in view of the reliability of the second conductive section 104 in contact with the first conductive sections 1031, e.g., any pattern in a hollow structure, e.g., grid-shape as illustrated in FIG. 12 or "回"-shape as illustrated in FIG. 13 or "巾"-shape as illustrated in FIG. 14, and of course any other structure, e.g., a helix, etc., as long as a particular pattern thereof can ensure the reliability of the second conductive section 104 in contact with the first conductive sections 1031, so a description thereof will not be repeated herein.

Figure 15:
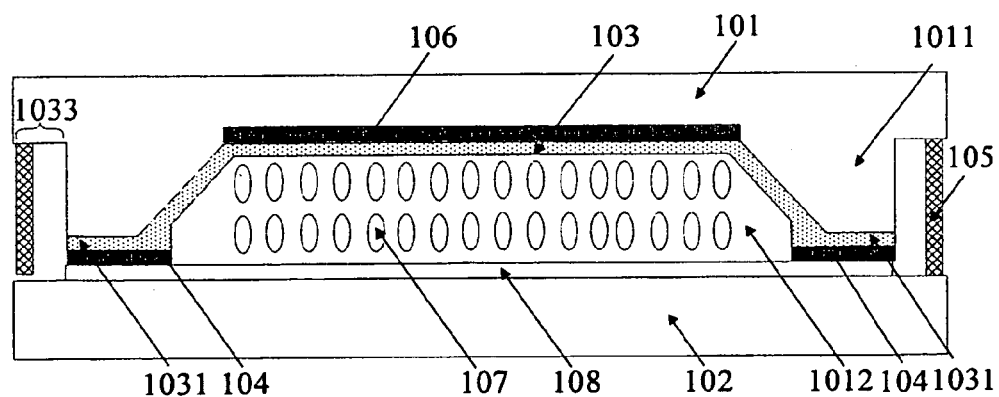
FIG. 15 is a simplified cross-sectional view of an LCD display panel according to an embodiment of the invention in a sectional view.

In correspondence to an LCD display panel, the first substrate 101 is a color filter substrate, and in correspondence to an OLED display panel, the first substrate 101 is a packet substrate. The LCD display panel and the OLED display panel further include other common layered structures, for example, the LCD display panel can include a Thin Film Transistor (TFT) layer, a color filter layer and a liquid crystal layer; and the OLED display panel can include a TFT layer and an organic electro-luminescence layer. A detailed description thereof is as follows:

Referring to FIG. 15, taking an LCD display panel as an example, the display panel includes a first substrate 101, a second substrate 102, wherein a concave groove 1012 surrounded by a convex section 1011 is disposed on the side of the first substrate 101 opposite to the second substrate 102. An electrode layer 103 including at least one first conductive section 1031 extending outward from inside of the concave groove 1012 and located on the top end face of the convex section 1011 is disposed on the surface of the concave groove 1012; and at least one second conductive section 104 electrically connected with the respective first conductive section 1031 is disposed on the second substrate 102.

There is a preset spacing 1033 between the projection of the convex section 1011 onto the first substrate 101 in the vertical direction and the edge of the first substrate 101, and a frame seal 105 is disposed in the preset spacing 1033 to bond the first substrate 101 and the second substrate 102 together.

A color filter layer 106 is further disposed on the first substrate 101 between the first substrate 101 and the electrode layer 103, and a TFT layer 108 is disposed on the second substrate 102 between the second conductive section 104 and the second substrate 102.

After the first substrate 101 and the second substrate 102 are bonded together, the respective first conductive sections 1031 and the respective second conductive sections 104 are electrically connected so that an electrical signal is transmitted between the first substrate 101 and the second substrate 102.

Figure 16:
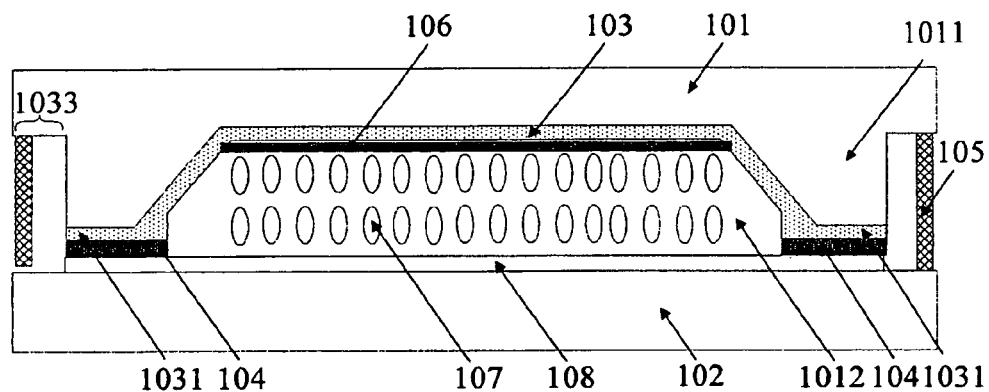
FIG. 16 is a simplified cross-sectional view of another LCD display panel according to an embodiment of the invention in a sectional view.

In this embodiment, numerous variants of the LCD display panel illustrated in FIG. 15 are possible, for example, the color filter layer 106 can be disposed between the electrode layer 103 and a liquid crystal layer 107 as illustrated in FIG. 16 instead of being disposed between the electrode layer 103 and the first substrate 101.

Figure 17:
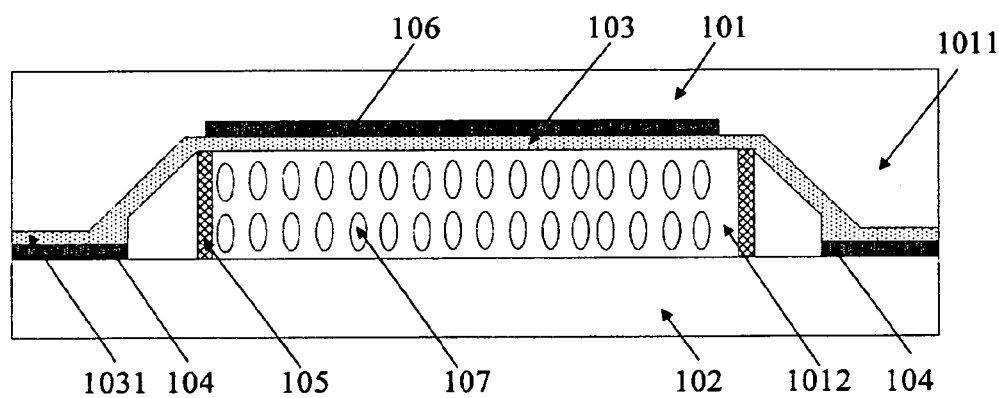
FIG. 17 is a simplified cross-sectional view of another LCD display panel according to an embodiment of the invention in a sectional view.

Referring to FIG. 17, there is provided another LCD display panel including a first substrate 101, a second substrate 102, wherein a concave groove 1012 surrounded by a convex section 1011 is disposed on the side of the first substrate 101 opposite to the second substrate 102. An electrode layer 103 including at least one first conductive section 1031 extending outward from inside of the concave groove 1012 and located on the top end face of the convex section 1011 is disposed on the surface of the concave groove 1012; and at least one second conductive section 104 electrically connected with the respective first conductive section 1031 is disposed on the second substrate 102.

The projection of the convex section 1011 onto the first substrate 101 in the vertical direction is flush with the edge of the first substrate 101, and a frame seal 105 is disposed in the range of the projection thereof onto the first substrate 101 or the second substrate 102 in the vertical direction to bond the first substrate 101 and the second substrate 102 together.

A color filter layer 106 is further disposed on the first substrate 101 between the first substrate 101 and the electrode layer 103, and a TFT layer 108 is disposed on the second substrate 102 between the second conductive section 104 and the second substrate 102.

After the first substrate 101 and the second substrate 102 are bonded together, the respective first conductive sections 1031 and the respective second conductive sections 104 are electrically connected so that an electrical signal is transmitted between the first substrate 101 and the second substrate 102.

Figure 18:
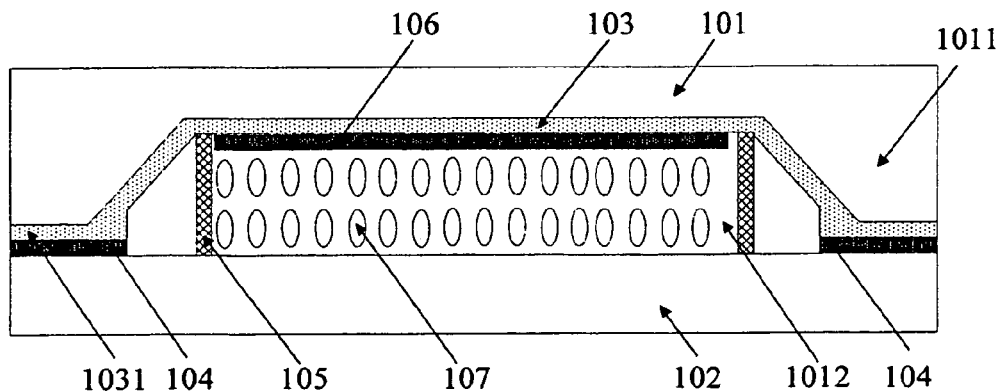
FIG. 18 is a simplified cross-sectional view of another LCD display panel according to an embodiment of the invention in a sectional view.

In this embodiment, numerous variants of the LCD display panel illustrated in FIG. 17 are possible, for example, the color filter layer 106 can be disposed between the electrode layer 103 and a liquid crystal layer 107 as illustrated in FIG. 18 instead of being disposed between the electrode layer 103 and the first substrate 101.

Figure 19:
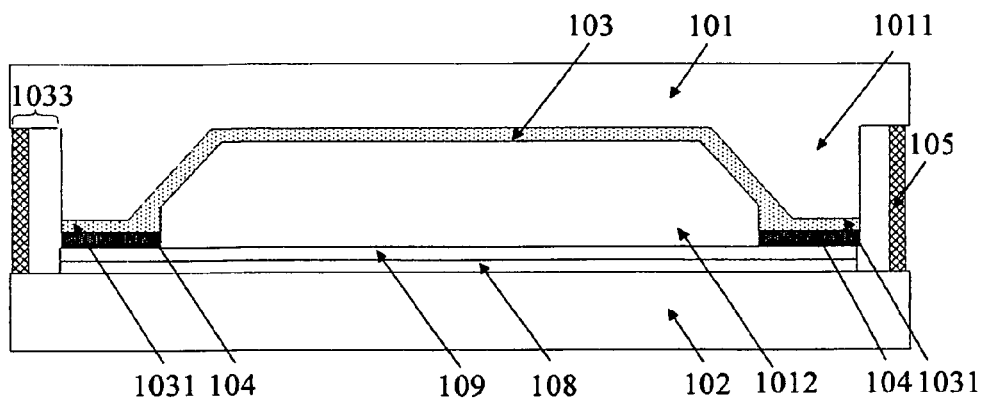
FIG. 19 is a simplified cross-sectional view of a particular OLED display panel according to an embodiment of the invention in a sectional view.

Referring to FIG. 19, taking an OLED display panel as an example, the display panel includes a first substrate 101, a second substrate 102, wherein a concave groove 1012 surrounded by a convex section 1011 is disposed on the side of the first substrate 101 opposite to the second substrate 102. An electrode layer 103 including at least one first conductive section 1031 extending outward from inside of the concave groove 1012 and located on the top end face of the convex section 1011 is disposed on the surface of the concave groove 1012; and at least one second conductive section 104 electrically connected with the respective first conductive section 1031 is disposed on the second substrate 102.

There is a preset spacing 1033 between the projection of the convex section 1011 onto the first substrate 101 in the vertical direction and the edge of the first substrate 101, and a frame seal 105 is disposed in the preset spacing 1033 to bond the first substrate 101 and the second substrate 102 together.

A TFT layer 108 and an organic electro-luminescence layer 109 are disposed in that order on the second substrate 102, and the second conductive section 104 is disposed on the organic electro-luminescence layer 109.

After the first substrate 101 and the second substrate 102 are bonded together, the respective first conductive sections 1031 and the respective second conductive sections 104 are electrically connected so that an electrical signal is transmitted between the first substrate 101 and the second substrate 102.

In this embodiment, numerous variants of the OLED display panel illustrated in FIG. 19 are possible, for example, the convex section 1011 is located in close proximity to the edge of the first substrate 101, and the frame seal 105 is disposed in the region of the projection of the concave groove 1012. The frame seal 105 is disposed in the OLED display panel similarly to the disposition of the frame seal 105 in the LCD display panels illustrated in FIG. 17 and FIG. 18.

It shall be noted that the electrode layer 103 in the respective embodiments above can be a touch control electrode layer or can be a common electrode layer. When the electrode layer 103 is a touch control electrode layer, the touch control electrode layer disposed on the first substrate 101 is easy and simple to be implemented. For the OLED display panel, circuits and drive signals are increasingly complicated, and each pixel circuit on the second substrate 102 which is an array substrate may include a plurality of TFTs, so it is very difficult to dispose the touch control electrode layer on the second substrate 102; and the idea of the invention lies in the disposition of the touch control electrode layer on the first substrate 101 to perform a touch control function, and the use of the conduction scheme in the embodiments above can low the difficulty with performing an inbuilt touch control function. For the LCD display panel, a common electrode layer and a pixel electrode layer are typically disposed on the second substrate 102, and a coupling capacitor formed between the common electrode layer and the pixel electrode layer may influence the sheet resistivity of the common electrode layer delaying a common electrode signal. As per the idea of the invention, when the electrode layer 103 is a common electrode layer, the electrode layer 103 is disposed on the first substrate 101, and the pixel electrode layer cooperating with the electrode layer 103 to generate an electric field is disposed on the second substrate 102, so the resulting increase in spacing between the electrode layer 103 and the pixel electrode layer can lower effectively the coupling capacitor between the common electrode layer and the pixel electrode layer to thereby lower the sheet resistivity of the common electrode layer and improve the delay of a common electrode layer.

Advantageous effects of the embodiments of the invention are as follows: the concave groove is dispose on the first substrate, and the electrode layer configured to perform a touch control function is formed on the surface of the concave groove so that the electrode layer extends outward from inside of the concave groove onto the convex section surrounding the concave groove to form the first conductive sections, and the first substrate and the second substrate can be bonded together to thereby electrically connect the first conductive sections with the second conductive sections so that an electrical signal is transmitted between the first substrate and the second substrate. The implementation process of this conduction scheme is simple and lost cost. Furthermore, this conduction scheme can be applicable to the performance of a touch control function and a display function in various types of LCD or OLED display panels, thereby greatly reducing the manufacturing difficulty.

Second Embodiment

An embodiment of the invention provides a display device including the display panel according to the first embodiment. The display device can be applied to a high-definition digital TV set, a computer (desktop and notebook), a handset, a Personal Digital Assistant (PDA) device, a Global Position System (GPS) device, an on-vehicle display, a projection display, a video camera, a digital camera, an electric watch, a calculator, an electronic instrument, a meter, a public display, a phantom display, etc.

Third Embodiment

Figure 20:
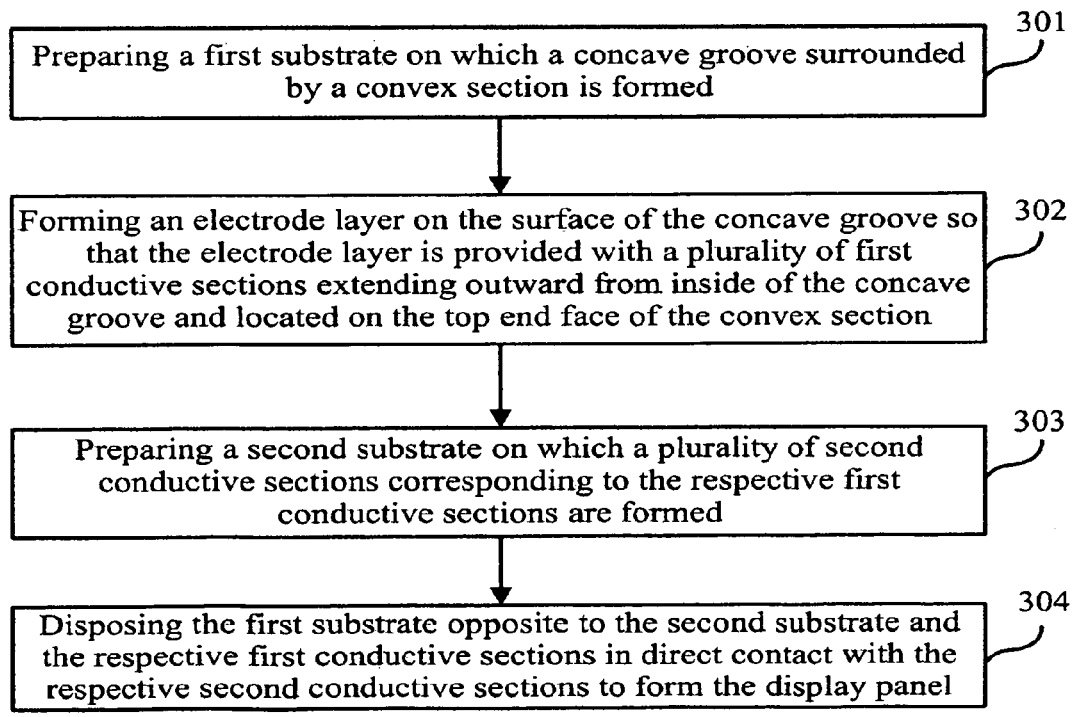
FIG. 20 is a flow chart of a method of manufacturing a display panel according to an embodiment of the invention.

Referring to FIG. 20, an embodiment of the invention provides a method of manufacturing a display panel. The method includes:

Step 301: preparing (providing) a first substrate in which a concave groove is formed. The concave groove is surrounded by a convex section located on the outer periphery of the first substrate.

In this embodiment, the concave groove surrounded by the convex section can be easily formed in the first substrate by an etching process. The convex section can be disposed in close proximity to the edge of the first substrate, and since the convex section is disposed directly on the first substrate so that the disposed convex section is actually integral with the first substrate. The term "in close proximity" can mean that the edge of the first substrate is not etched, and at this time the outer edge of the convex section is flush with the outer edge of the first substrate. Alternatively, there can be a preset spacing between the projection of the convex section onto the first substrate or the second substrate in the vertical direction and the edge of the first substrate or the second substrate, that is, an etching process can also be performed at the edge of the first substrate to form a preset spacing (a recess at a predetermined depth).

Step 302: forming an electrode layer on the surface of the concave groove so that the electrode layer is provided with a plurality of first conductive sections extending outward from inside of the concave groove and located on the top end face (top surface) of the convex section.

Step 303: preparing (providing) a second substrate having a plurality of second conductive sections corresponding to the respective first conductive sections.

Step 304: bringing the first substrate and the second substrate together and aligning the respective first conductive sections in direct contact with the respective second conductive sections to form the display panel.

Particularly, if the outer edge of the convex section is flush with the outer edge of the first substrate, then a frame seal is disposed in the range of the vertical projection of the concave groove onto the first substrate or the second substrate; and the first substrate and the second substrate are bonded together so that the respective first conductive sections come into direct contact with the respective second conductive sections to form the display panel.

If there is a preset spacing between the outer edge of the convex section and the outer edge of the first substrate, then a frame seal is disposed in the preset spacing; and the first substrate and the second substrate are bonded together so that the respective first conductive sections come into direct contact with the respective second conductive sections to form the display panel.

Advantageous effects of the embodiment of the invention are as follows: the concave groove is disposed on the first substrate, and the electrode layer configured to perform a touch control function is formed on the surface of the concave groove so that the electrode layer extends outward from inside of the concave groove onto the convex section surrounding the concave groove to form the first conductive sections, and the first substrate and the second substrate can be bonded together to thereby electrically connect the first conductive sections with the second conductive sections so that an electrical signal is transmitted between the first substrate and the second substrate, and the implementation process of this conduction scheme is easy and low cost.

Figure 21:
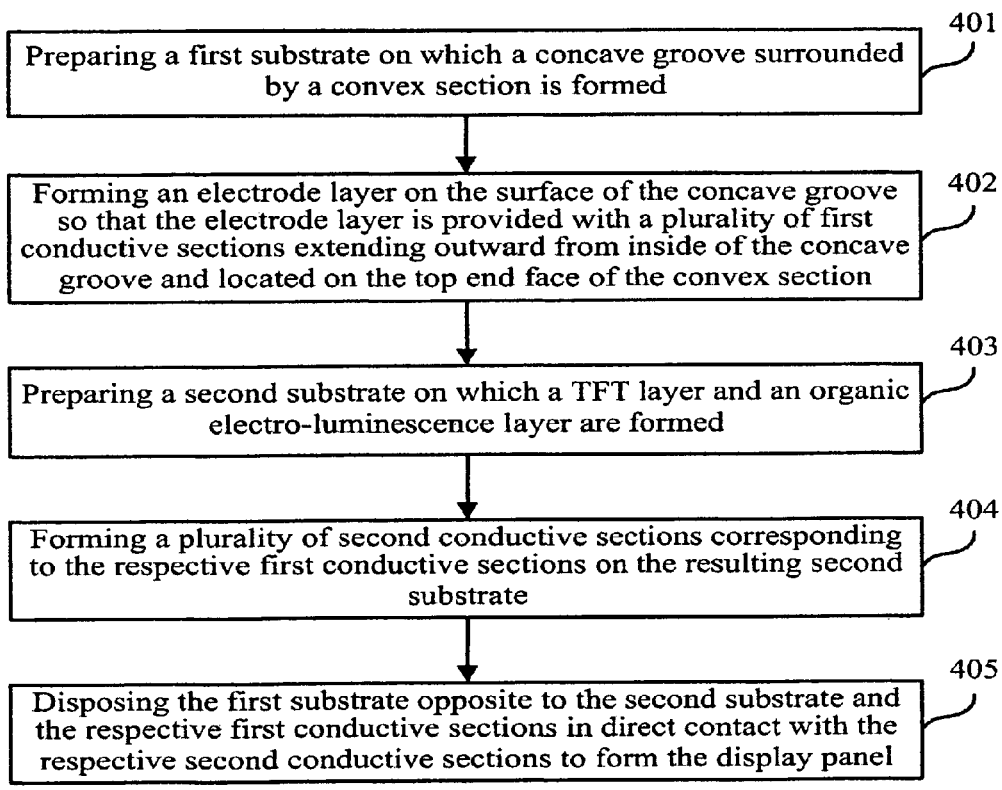
FIG. 21 is a flow chart of a method of manufacturing an OLED display panel according to an embodiment of the invention.

Referring to FIG. 21, an embodiment of the invention provides a method of manufacturing an OLED display panel. The method includes:

Step 401: providing a first substrate in which a concave groove surrounded by a convex section is formed.

In this embodiment, the concave groove surrounded by the convex section can be formed on the first substrate in an etching process easy to perform. The convex section can be disposed in close proximity to the edge of the first substrate, and since the convex section is disposed directly on the first substrate so that the disposed convex section is actually integral with the first substrate. The term "in close proximity" can mean that the edge of the first substrate is not etched, and at this time the outer edge of the convex section is flush (coplanar) with the outer edge of the first substrate. Alternatively, there can be a preset spacing between the projection of the convex section onto the first substrate or the second substrate in the vertical direction and the edge of the first substrate or the second substrate, that is, an etching process can also be performed at the edge of the first substrate to form a preset spacing (a recess at a predetermined depth).

Step 402: forming an electrode layer on the surface of the concave groove so that the electrode layer is provided with a plurality of first conductive sections extending outward from inside of the concave groove and located on the top end face of the convex section.

The electrode layer can be a touch control electrode layer to perform a touch control function of the OLED display panel; or the electrode layer can be a common electrode layer.

Step 403: providing a second substrate on which a TFT layer and an organic electro-luminescence layer are formed.

Step 404: forming a plurality of second conductive sections corresponding to the respective first conductive sections on the resulting second substrate Step 405: bringing the first substrate and the second substrate together and aligning the respective first conductive sections in direct contact with the respective second conductive sections to form the display panel.

Particularly, if the outer edge of the convex section is flush (coplanar) with the outer edge of the first substrate, then a frame seal is disposed in the range of the vertical projection of the concave groove onto the first substrate or the second substrate; and the first substrate and the second substrate are bonded together so that the respective first conductive sections come into direct contact with the respective second conductive sections to form the display panel.

If there is a preset spacing (a recess with a predetermined depth) between the outer edge of the convex section and the outer edge of the first substrate, then a frame seal is disposed in the preset spacing; and the first substrate and the second substrate are bonded together so that the respective first conductive sections come into direct contact with the respective second conductive sections to form the display panel.

Advantageous effects of the embodiment of the invention are as follows: the concave groove is disposed on the first substrate, and the electrode layer configured to perform a touch control function is formed on the surface of the concave groove so that the electrode layer extends outward from inside of the concave groove onto the convex section surrounding the concave groove to form the first conductive sections, and the first substrate and the second substrate can be bonded together to thereby electrically connect the first conductive sections with the second conductive sections so that an electrical signal is transmitted between the first substrate and the second substrate, and the implementation process of this conduction scheme is simple and low cost.

Figure 22:
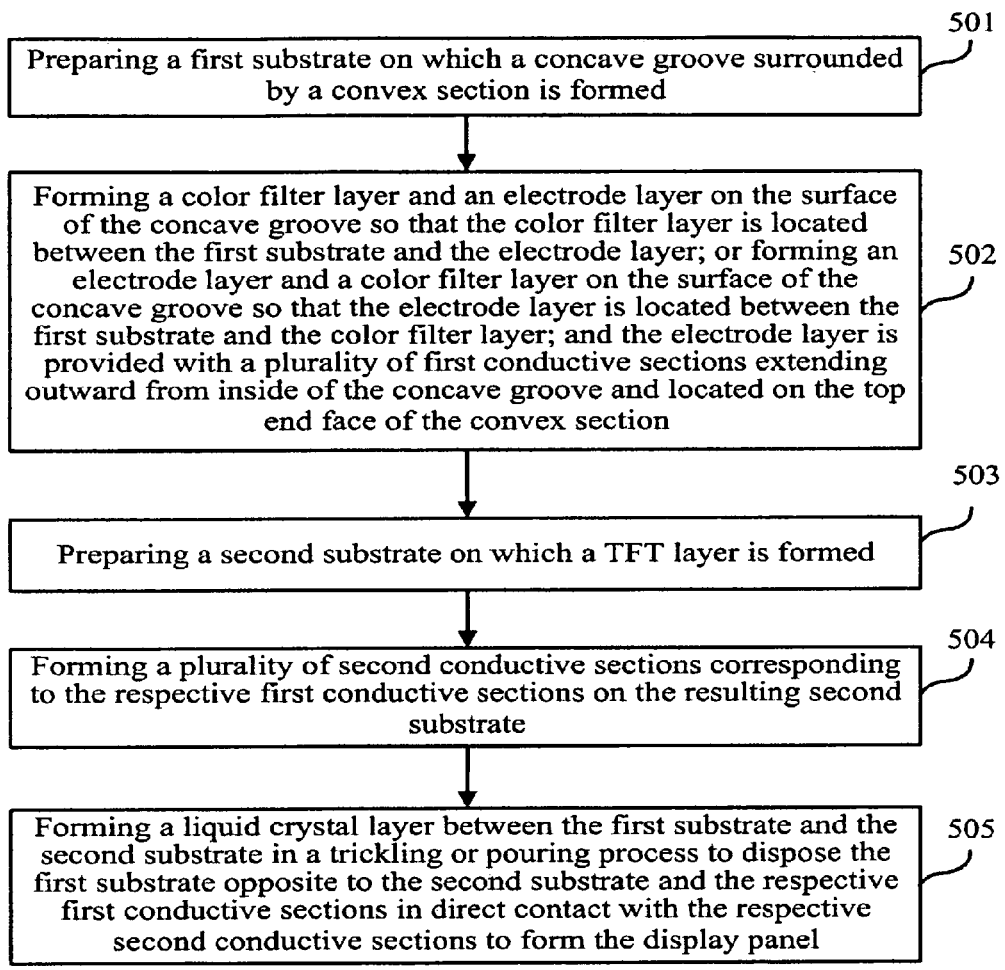
FIG. 22 is a flow chart of a method of manufacturing an LCD display panel according to an embodiment of the invention.

Referring to FIG. 22, a method of manufacturing an LCD display panel according to an embodiment of the invention includes:

Step 501: providing a first substrate in which a concave groove surrounded by a convex section is formed.

In this embodiment, the concave groove surrounded by the convex section can be formed on the first substrate by a simple etching process. The convex section can be disposed in close proximity to the edge of the first substrate, and since the convex section is disposed directly on the first substrate so that the disposed convex section is actually integral with the first substrate, "in close proximity" here can mean that the edge of the first substrate is not etched, and at this time the outer edge of the convex section is flush with the outer edge of the first substrate. Alternatively, there can be a preset spacing between the projection of the convex section onto the first substrate or the second substrate in the vertical direction and the edge of the first substrate or the second substrate, that is, an etching process can also be performed at the edge of the first substrate to form a preset spacing (a recess with a predetermined depth).

Step 502: forming a color filter layer and an electrode layer on the surface of the concave groove so that the color filter layer is located between the first substrate and the electrode layer; or forming an electrode layer and a color filter layer on the surface of the concave groove so that the electrode layer is located between the first substrate and the color filter layer; and the electrode layer is provided with a plurality of first conductive sections extending outward from inside of the concave groove and located on the top end face (top surface) of the convex section.

The electrode layer can be a touch control electrode layer to perform a touch control function of the LCD display panel; or the electrode layer can be a common electrode layer.

Step 503: providing a second substrate on which a TFT layer is formed.

Step 504: forming a plurality of second conductive sections corresponding to (associated with) the respective first conductive sections on the resulting second substrate Step 505: forming a liquid crystal layer between the first substrate and the second substrate in a trickling or pouring process to dispose the first substrate opposite to the second substrate and the respective first conductive sections in direct contact with the respective second conductive sections to form the display panel.

Particularly if the outer edge of the convex section is flush (coplanar) with the outer edge of the first substrate, then a frame seal is disposed in the range of the vertical projection of the concave groove onto the first substrate or the second substrate; and the first substrate and the second substrate are bonded together so that the respective first conductive sections come into direct contact with the respective second conductive sections to form the display panel.

If there is a preset spacing between the outer edge of the convex section and the outer edge of the first substrate, then a frame seal is disposed in the preset spacing; and the first substrate and the second substrate are bonded together so that the respective first conductive sections come into direct contact with the respective second conductive sections to form the display panel.

Advantageous effects of the embodiment of the invention are as follows: the concave groove is disposed on the first substrate, and the electrode layer configured to perform a touch control function is formed on the surface of the concave groove so that the electrode layer extends outward from inside of the concave groove onto the convex section surrounding the concave groove to form the first conductive sections, and the first substrate and the second substrate can be bonded together to thereby electrically connect the first conductive sections with the second conductive sections so that an electrical signal is transmitted between the first substrate and the second substrate, and the implementation process of this conduction scheme is simple and low cost.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

What is claimed is:

1. A display panel, comprising:
   a first substrate and a second substrate disposed opposite to each other, the first substrate having a convex section on an outer periphery, the convex section defining a concave groove facing the second substrate, wherein the concave groove is surrounded by the convex section on the outer periphery of the first substrate;
   an electrode layer disposed on an inside surface of the concave groove and including at least one first conductive section extending outward from inside of the concave groove to a top end surface of the convex section; and
   at least one second conductive section disposed on the second substrate and electrically connected with the first conductive section at the top end surface of the convex section.

2. The display panel according to claim 1, further comprising a preset spacing between a projection of the convex section onto the first substrate or the second substrate in a vertical direction and an edge of the first substrate or the second substrate.

3. The display panel according to claim 2, further comprising a frame seal located in a region of the vertical projection of the concave groove onto the first substrate or the second substrate or located in the preset spacing.

4. The display panel according to claim 1, wherein a pattern of the projection of the convex section onto the first substrate or the second substrate in the vertical direction is the same as a pattern of an edge frame of the display panel and the convex section is a continuous and integral structure; or the pattern of the projection of the convex section onto the first substrate or the second substrate in the vertical direction is the same as the pattern of an edge frame of the display panel, and the convex section includes a plurality of discrete convex sub-sections.

5. The display panel according to claim 4, wherein the pattern of the projection of the convex section onto the first substrate or the second substrate in the vertical direction is rectangular, and the first conductive section is distributed on the top end face of at least one edge frame of the convex section.

6. The display panel according to claim 1, wherein the second conductive section is a conductive pad in a continuous and integral structure, or is a conductive pad in a hollow structure.

7. The display panel according to claim 6, wherein the conductive pad in the hollow structure is grid-shaped or "回"-shaped or "申"-shaped or helical shaped.

8. The display panel according to claim 1, further comprising a thin film transistor layer disposed between the second conductive section and the second substrate.

9. The display panel according to claim 8, further comprising an organic electro-luminescence layer disposed between the thin film transistor layer and the second conductive section, wherein the organic electro-luminescence layer is electrically connected with the thin film transistor layer.

10. The display panel according to claim 8, further comprising:
    a color filter layer located between the first substrate and the electrode layer; or disposed on the electrode layer; and
    a liquid crystal layer disposed between the first substrate and the second substrate.

11. The display panel according to claim 1, wherein the electrode layer is a touch control electrode layer; or the electrode layer is a common electrode layer.

12. A display device, comprising the display panel according to claim 1.

* * * * *